(12) United States Patent
Nirschl et al.

(10) Patent No.: US 9,153,293 B2
(45) Date of Patent: Oct. 6, 2015

(54) OPERATION SCHEME FOR NON-VOLATILE MEMORY

(71) Applicant: Infineon Technologies AG, Neubiberg (DE)

(72) Inventors: Thomas Nirschl, Putzbrunn (DE); Jan Otterstedt, Unterhaching (DE); Alexander Duch, München (DE)

(73) Assignee: Infineon Technologies AG, Neubiberg (DE)

( * ) Notice: Subject to any disclaimer, the term of this patent is extended or adjusted under 35 U.S.C. 154(b) by 213 days.

(21) Appl. No.: 13/690,299

(22) Filed: Nov. 30, 2012

(65) Prior Publication Data

US 2014/0153348 A1    Jun. 5, 2014

(51) Int. Cl.
G11C 29/00 (2006.01)
G11C 7/00 (2006.01)
G11C 16/04 (2006.01)
G11C 16/34 (2006.01)

(52) U.S. Cl.
CPC .............. *G11C 7/00* (2013.01); *G11C 16/0425* (2013.01); *G11C 16/349* (2013.01); *G11C 16/3427* (2013.01)

(58) Field of Classification Search
USPC ................ 365/201, 189.07, 185.24, 185.11
See application file for complete search history.

(56) References Cited

U.S. PATENT DOCUMENTS

| | | | |
|---|---|---|---|
| 6,674,669 B2 * | 1/2004 | Tuan et al. | 365/185.28 |
| 7,236,413 B2 * | 6/2007 | Nishihara | 365/200 |
| 7,813,169 B2 * | 10/2010 | Kux et al. | 365/185.02 |
| 8,169,833 B2 * | 5/2012 | Halabi et al. | 365/185.24 |
| 8,176,367 B2 * | 5/2012 | Dreifus et al. | 714/47.3 |
| 8,243,520 B2 | 8/2012 | Chan et al. | |
| 2014/0143471 A1 * | 5/2014 | Moyer et al. | 710/310 |

* cited by examiner

*Primary Examiner* — Pho M Luu
(74) *Attorney, Agent, or Firm* — Murphy, Bilak & Homiller, PLLC (57) ABSTRACT

A method of operating an integrated circuit includes determining at least one characteristic of at least one memory cell and conducting an operation for the at least one memory cell, wherein based on the at least one characteristic determined a disturbance for at least one additional memory cell is adjusted.

29 Claims, 6 Drawing Sheets

OPERATION SCHEME FOR NON-VOLATILE MEMORY

TECHNICAL FIELD

Embodiments relate generally to semiconductor devices, and in particular to memory cells such as, for example, flash memory cells.

BACKGROUND

Figure 1:
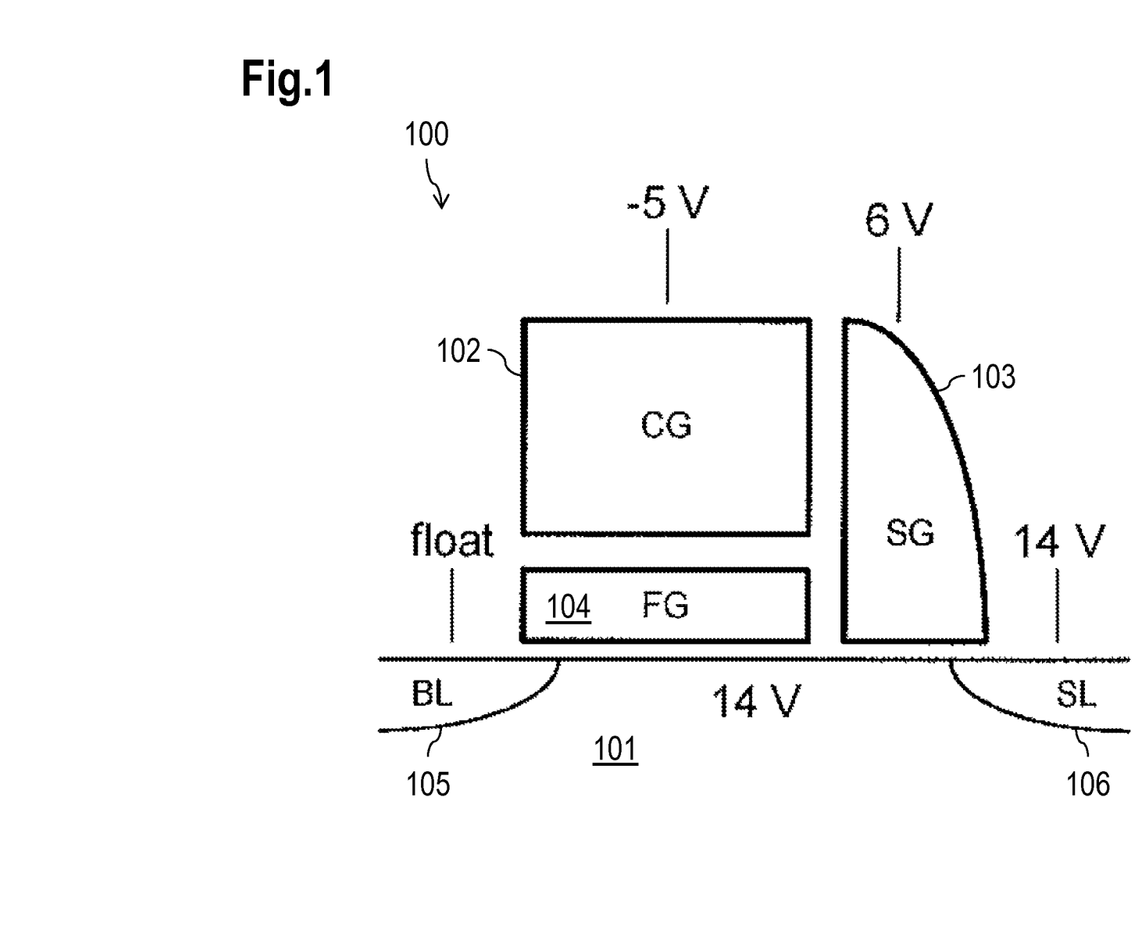
FIG. 1 shows an exemplary flash memory cell during an erase operating condition.

FIG. 1 depicts an exemplary flash memory cell 100 during an erase operating condition. A memory field may comprise HS3P (Hot Source Triple Poly) memory cells, organized in rows and columns To erase the cell, a strong electric field from a well 101 to a control gate (CG) 102 is employed to initiate Fowler-Nordheim tunneling of electrons from a floating gate (FG) 104 to the well 101. A select gate (SG) 103 is kept at an intermediate voltage to evenly distribute the electric stress to the two oxides of the spacer poly. A bitline (BL) 105 is floating, whereas a source line (SL) 106 is at the same potential as the well 101.

In the example according to FIG. 1, the well 101 and the source line (SL) 106 are at 14V, −5V is applied to the control gate (CG) 102, and 6V is supplied to the select gate (SG) 103.

Figure 2:
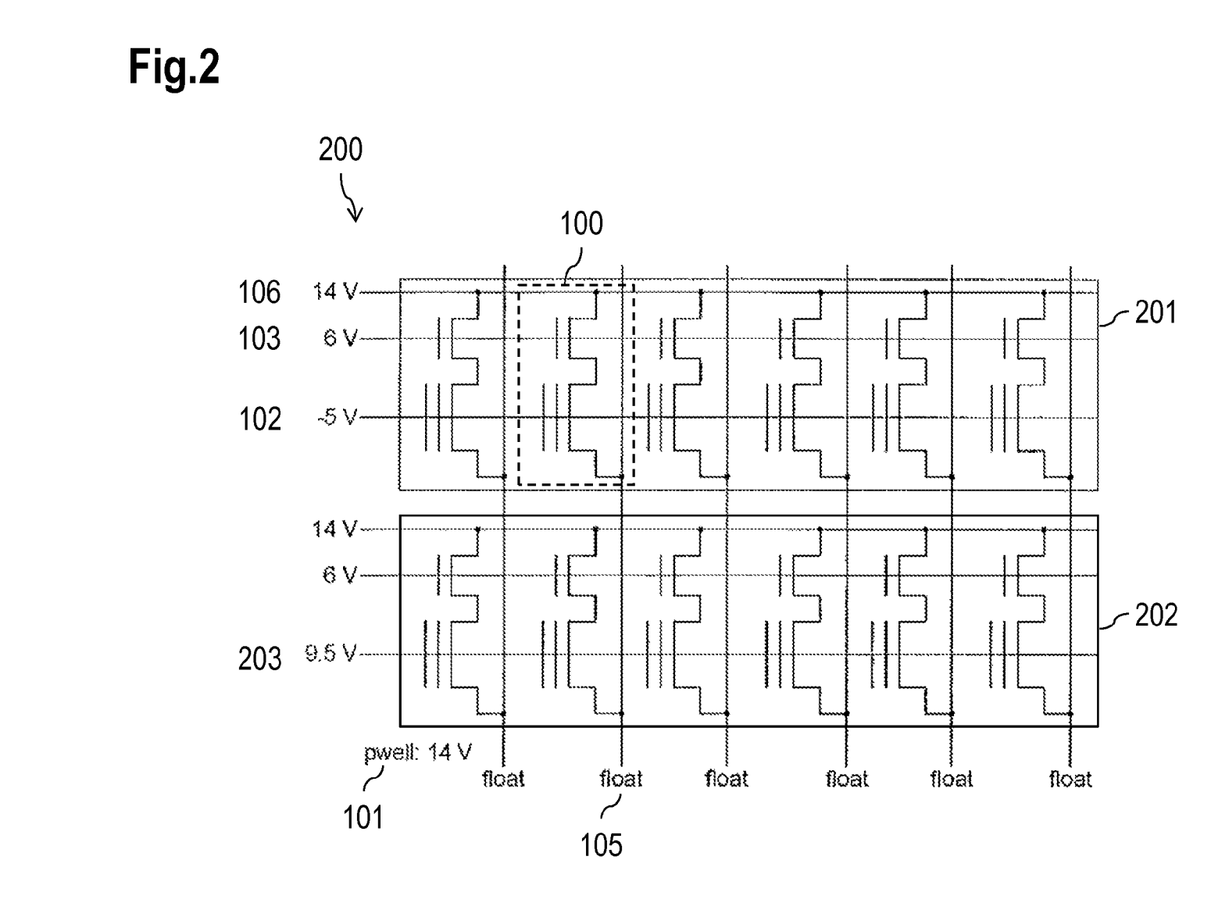
FIG. 2 shows a memory field during an exemplary erase condition.

FIG. 2 shows a memory field 200 during an exemplary erase condition. In this example, a page 201 is selected via the control gate (CG) 102, wherein the memory cell 100 according to FIG. 1 is located within the page 201. Erasing the page 201 by an erase pulse has an impact on electrically coupled memory cells, e.g., a page 202 to which a voltage amounting to 9.5V is applied via a control gate (CG) 203.

Typically, blocks of cells are erased simultaneously, such as a complete row or a group of rows in an array (in FIG. 2 shown as page 201), for example. After such a block erase, not all cells of the block have exactly the same threshold voltage, but have a normal distribution of threshold voltages due to the variations between cells.

A single erase pulse can be used to erase the memory cell 100, but with a trade-off between a cycling endurance and a disturbance of other memory cells or pages of the semiconductor device.

One problem associated with non-volatile memories, e.g., EEPROMs (Electrically Erasable Programmable Read-Only Memories), is that after repeated programming cycles (i.e. writing and erasing), there is a change in the programming behavior of the cells (i.e. the write behavior and the erase behavior). This change is normally caused by an accumulation of trapped charges in proximity to the floating gate which can affect either the reading of the cell and/or the electron tunneling characteristics during writing and erasing. Such effects can be referred to as endurance or cycling degradation. Over time, the accumulation of trapped charges from such cycling changes the threshold voltage distribution of the blocks of cells being in the erased state. Generally, cycling degradation causes an increase in the threshold voltages over time. Eventually, the erase threshold voltage of some cells may be increased to a level that causes errors and therefore limits the allowable number of cycles of the memory.

SUMMARY

A first embodiment relates to a method of operating an integrated circuit, the method comprising: determining at least one characteristic of at least one memory cell; and conducting an operation for the at least one memory cell, wherein based on the at least one characteristic determined a disturbance for at least one additional memory cell is adjusted.

A second embodiment relates to an integrated circuit comprising: a non-volatile memory comprising a first memory portion and a second memory portion; and a controller configured to determine at least one characteristic of the first memory portion; and to conduct an operation for the first memory portion, wherein based on the at least one characteristic determined for the first memory portion a disturbance for the second memory portion is adjusted.

A third embodiment relates to a system for operating an integrated circuit comprising: means for determining at least one characteristic of a first memory portion; and means for conducting an operation for the first memory portion, wherein based on the at least one characteristic determined a disturbance for a second memory portion is adjusted.

A forth embodiment is directed to a method for conducting an operation for a first memory portion, the method comprising: determining at least one characteristic of the first portion of memory; and conducting the operation for the first portion of memory, wherein based on the at least one characteristic determined a disturbance for a second portion of memory is adjusted.

The operation may comprise at least one of a read operation, a write operation and an erase operation.

Those skilled in the art will recognize additional features and advantages upon reading the following detailed description, and upon viewing the accompanying drawings.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

The embodiments described herein utilize adjusting a disturbance during an operation of at least one memory cell, e.g., a block or page of memory cells of a non-volatile memory of an integrated circuit. The operation may comprise an erase operation, a write operation or a read operation. Several such operations can be combined together as well. It is noted that the approach is exemplarily described for erase operations, but could be applied accordingly for other operations like write or read operations or combinations thereof.

The disturbance may be any effect based on a disturb voltage or a disturb current to at least one electrically coupled memory cell of the integrated circuit that is not to be erased. The at least one memory cell to be erased could also be regarded as a first portion of memory of the integrated circuit, wherein the erase operation has an impact on a second portion of memory of the same integrated circuit. This impact or disturbance can be reduced by the embodiments described herein. The first and second portions of memory may be organized in blocks or pages. It is further noted that the erase operation may also be part of, e.g., a write or an update mechanism.

The disturbance can be adjusted based on at least one characteristic (also referred to as "type") of the at least one memory cell to be erased, e.g., based on an application profile, usage characteristic, size and/or a memory utilization.

For example, the following characteristics (types) could be determined for the at least one memory cell.

A large accumulative disturb effect caused by a large portion or area of memory erased only for a few times; this may be the case for a memory portion that is rarely used for updates. Hence, the disturb effect is significant during an erase procedure; the erase procedures over lifetime of the device are still comparably large (due to the size of the memory being erased) although the erases procedures themselves are rather rare. Such memory portion may in particular comprise program code or other data that is changed rather infrequently. For example, an update or change of the memory's content may occur 100 times during the lifetime of the memory.

A large (or medium) accumulative disturb effect caused by a medium portion of memory that is cycled 10.000 to 50.000 or 100.000 times.

A small accumulative disturb effect caused by a small portion of memory that is cycled, e.g., more than 100.000 times.

It is noted that the types mentioned above are examples; other types (in particular a different number of types) as well as other characteristics (e.g., number of cycles) could be utilized accordingly.

At the beginning of the memory's lifetime, a lower erase bias is sufficient for erasing the memory compared to an erase bias used when the memory wears out. The reduced erase bias leads to a reduced amount of disturbance for other memory cells that are not to be erased.

Hence, the disturbance can be adjusted such that portions of memory that generate a small or short disturbance during an erase cycle can be erased utilizing a large disturb voltage. In addition, the disturbance can be adjusted such that for portions of memory that generate a large or long disturbance during an erase cycle can be erased using a small disturb voltage.

The disturb voltage can be adjusted based on the application profile and/or type of memory. The disturb voltage in this example is a voltage difference between the control gate and the well of a memory cell or a block (or page) that is not selected, e.g., being electrically coupled to the memory cell (block or page) that is to be erased.

Figure 3:
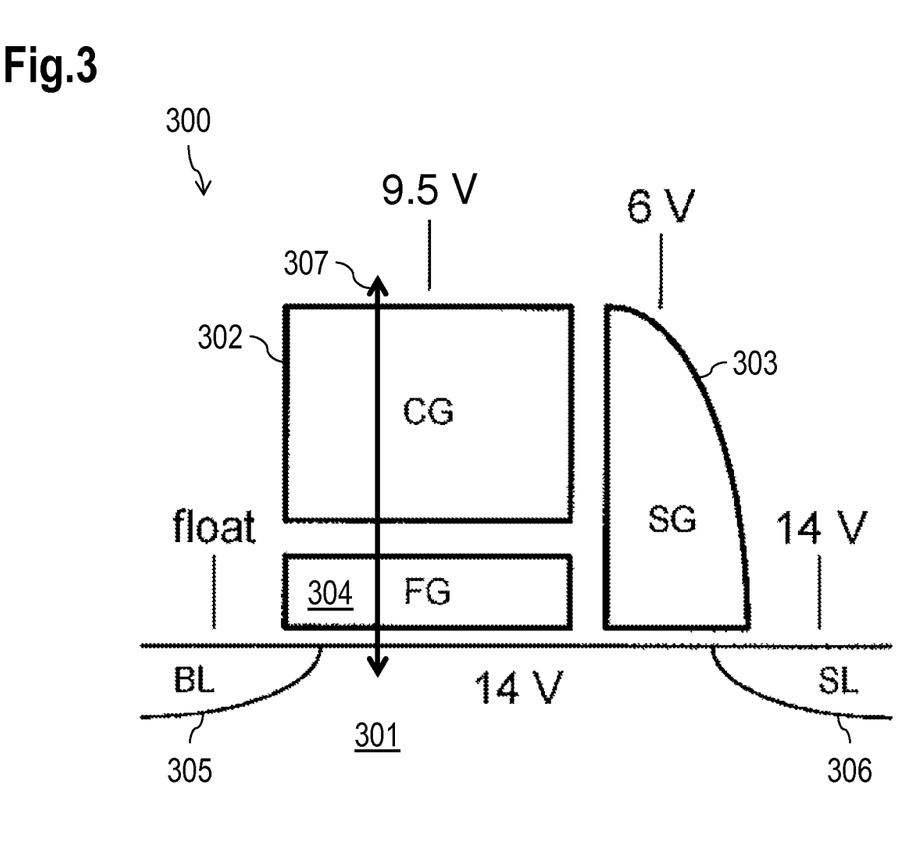
FIG. 3 shows a schematic diagram based on FIG. 1 comprising a flash memory cell that is not selected for an erase operation, but electrically coupled to one flash memory cell that is to be erased.

FIG. 3 shows a schematic diagram based on FIG. 1 comprising a flash memory cell 300 that is not selected and thus not to be erased. The memory cell 300 may be part of a larger block or page that could be electrically coupled to the memory cell 100 (or the page 201) that is to be erased.

The memory cell 300 comprises a well 301, a control gate (CG) 302, a select gate (SG) 303, a floating gate (FG) 304, a bitline (BL) 305 and a source line (SL) 306.

In FIG. 3, the well 301 and the source line (SL) 306 are at 14V, 9.5V is applied to the control gate (CG) 302, and 6V is supplied to a select gate (SG) 303.

A disturb voltage 307 indicates a voltage difference between the well 301 and the control gate (CG) 302. The disturb voltage 307 can be adjusted via the voltage that is applied to the control gate (CG) 302. Here the voltage of the well 301 of 14V is identical to the voltage of the well 101 that is defined by the erase operation for the memory cell 100. The voltage of the control gate 302 of the not selected cell 300 is limited by the highest voltage difference allowed to be applied to the voltage of the control gate 102 of the cell 100 to be erased. Increasing the 9.5V would be beneficial to reduce the disturb voltage 307, but not possible, because of a voltage difference limitation imposed by the circuitry providing the control gate with either −5V for the erase operation or 9.5V in the unselected case.

Hence, with an increasing number of erase cycles the erase voltage applied to the memory cell 100 to be erased can only be increased by increasing the common well 101, 301 voltage, which implies increasing the disturb voltage 307 thereby strengthening detrimental effects for the electrically coupled memory cell 300 that is not selected for the erase operation.

For a memory cell that is rarely updated, an initial erase voltage amounting to 17V may suffice and may exemplarily result in a disturb voltage for the memory cell 300 amounting to 2.5V. The erase voltage may suffice for the few erase cycles of this type of memory portion. However, if the memory portion is of a different type that is frequently updated and thus erased, the initial erase voltage may as well start at 17V. When this memory portion wears out, the erase voltage is increased, e.g., to 19V. This results in a change of the disturb voltage for the memory cell 300 amounting to 4.5V. It could be an exemplary requirement that the voltage difference between the voltage applied to the control gate 102 of the memory cell 100 and the voltage applied to the control gate 302 of the memory cell 300 may not exceed a predetermined threshold, e.g., 14.5V.

Figure 4:
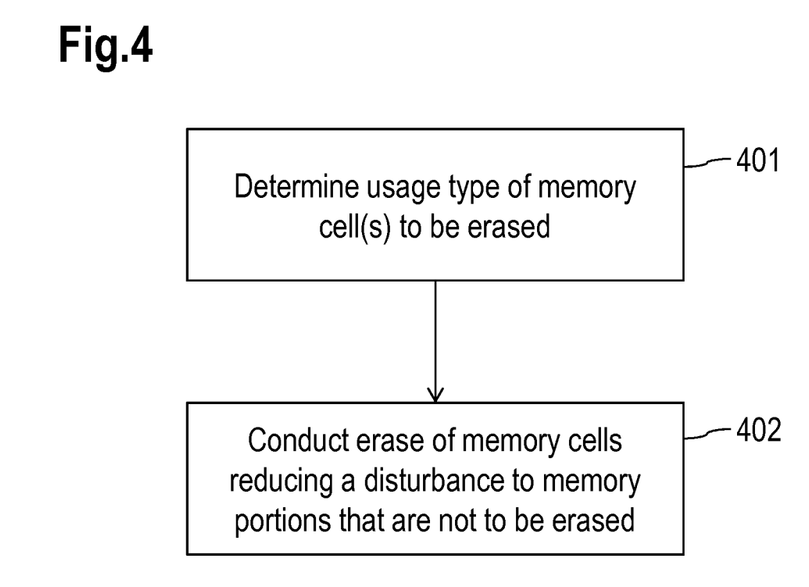
FIG. 4 shows an exemplary flow chart comprising steps for conducting an erase operation.

FIG. 4 shows an exemplary flow chart comprising steps for conducting an erase operation. In step 401, a type, e.g., a usage type of a memory cell to be erased is determined. The usage type may depend on the application profile, type of memory, use case for the memory portion, etc. The memory portion could be used for storing data or program code. The program code may be changed (e.g., updated) rather rarely, wherein user or program data may be changed quite often. However, different scenarios are applicable as well and may use different types of data or code in various manners and change the content of the memory portions differently. The example set forth herein is not intended to limit the scope of the concept presented as several types (even more than two) of memory portions could be utilized and the number of changes conducted for each of the type may change dependent on the particular scenario applied.

The type of the memory cell can be determined by a predefined parameter, e.g., factory setting, by configuration (e.g., a configuration parameter) or dynamically, e.g., based on an access pattern to the memory cell (such as, e.g., a pattern of read, write, or erase accesses to certain areas of the memory portions, etc.).

In step 402 the memory cell is erased, wherein a disturbance to an adjacent or any other memory cell(s) that are somehow (logically or electrically) coupled to the memory cell to be erased is reduced or minimized. It is noted that the memory cell referred to could comprise several memory cells, in particular memory cells can be arranged as blocks or pages. In addition, the memory cells could be coupled via a common well, a common gate or any other physical connection.

In other words, a first memory portion is selected to be erased and a second memory portion is not selected to be erased. Each memory portion may comprise at least one memory cell, block and/or page. The first and second memory portions may be parts of a semiconductor device, i.e. a non-volatile memory. The first and second memory portions may be physically and/or logically coupled via, e.g., a common well, a common gate or the like.

Figure 5:
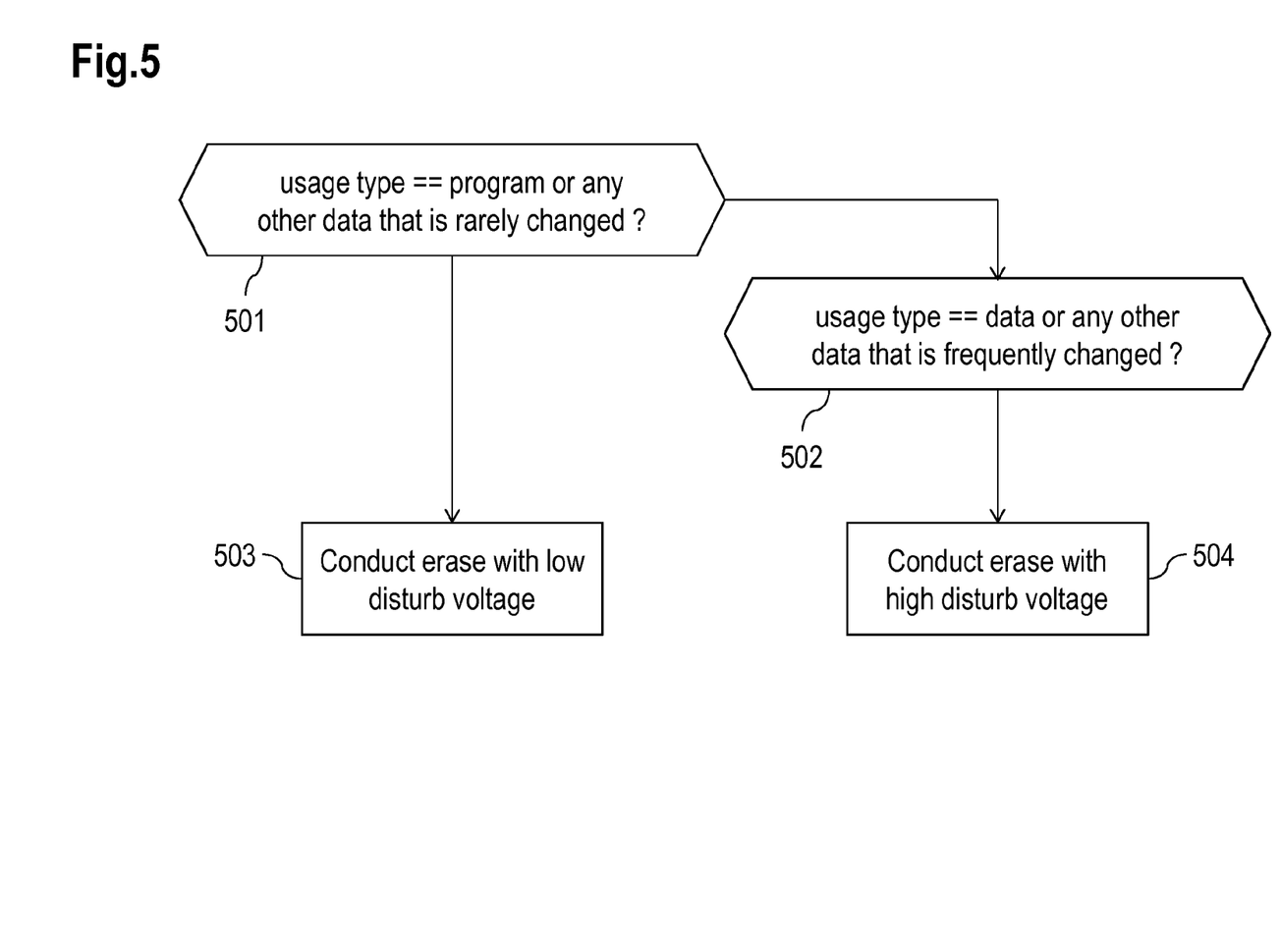
FIG. 5 shows a flow chart comprising an exemplary embodiment as how to adjust the disturb voltage of a memory cell or a block of memory cells electrically coupled to the at least one memory cell that is to be erased.

FIG. 5 shows a flow chart comprising an exemplary embodiment for adjusting the disturb voltage of a memory cell or a block of memory cells electrically coupled to the at least one memory cell that is to be erased. In step 501 it is determined whether a usage type of a memory portion comprises program code or any other data that is rather infrequently updated or changed. If this is the case, an erase operation with low disturb voltage for electrically coupled memory portion(s) is conducted in step 503. If the usage type is rather frequently changed or updated (step 502), an erase operation with a high disturb voltage is conducted in step 504.

Hence, the overall disturbance caused by a memory portion that is frequently changed can be deemed rather limited, especially if this type of memory to be erased is of small size. In addition, due to the preferably small size of the memory portion to be frequently updated, the disturbance has only a limited impact on electrically coupled memory cells that are not selected for the erase operation. In other words, an overall disturbance over time is limited because of the small size of the memory portion to be erased and the short duration of the erase voltage required. This is in particular beneficial for memory portions of small size, e.g., a few bits or bytes to be erased. Due to their limited size, their impact on electrically coupled memory cells not to be erased is also limited. In this regard, the disturb voltage could be high, because of the small overall disturbance caused by such memory cells to be erased.

On the other hand, program code may be updated only a few times compared to user data, but may occupy a large size on the circuit compared to the above-mentioned (short) data that is frequently updated. Hence, there may be two reasons to utilize a low erase voltage and thus adjust the disturb voltage accordingly: First, the reduced erase voltage allows for a reduced disturbance, which could be reflected by applying an according disturb voltage. Second, due to the low number of overall erase operations for this type of memory, a reduced erase voltage may suffice, because this type of memory (due to the reduced number of erase cycles) does not wear out as quickly as a memory portion that is more frequently updated. Hence, the less erase cycles, the lower the erase voltage and thus the lower the disturb voltage.

It is noted that the erase operation can be part of a programming step of the memory device, in particular a re-programming of the memory device or a portion thereof.

The erase voltage may have an exponential impact on the disturbance of electrically coupled memory cells, whereas the duration of an erase pulse has more or less linear impact on the disturbance. Hence, the duration and/or the voltage of the erase signal and/or of the disturb signal can be adjusted accordingly dependent on the respective use case or implementation.

The erase operation can be split into individual pulses. A read operation between the pulses can be used to detect whether an erase operation has been successful. It is noted that the erase voltage and/or timing of the erase voltage (e.g., pulse shape and/or duration) may be different for the different pulses. This applies accordingly to the disturb signal (e.g., disturb voltage) that is fed to the memory cell(s) not to be erased.

Figure 6:
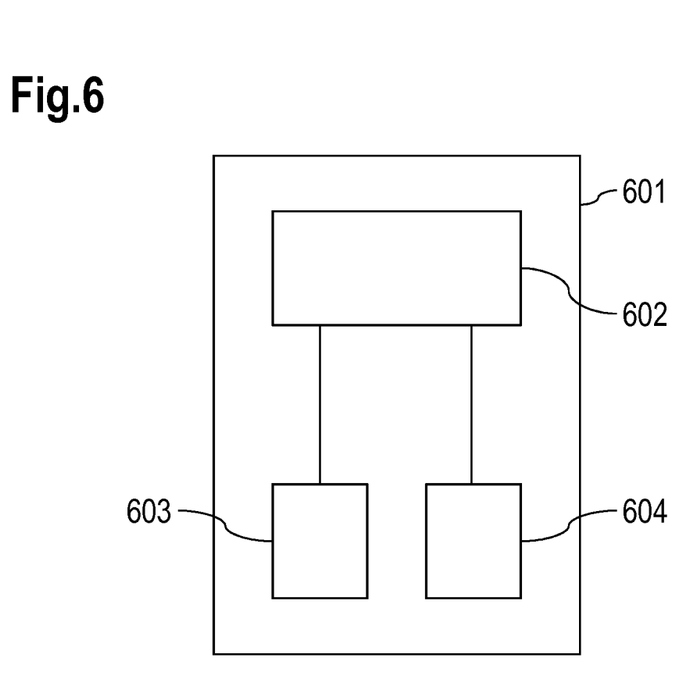
FIG. 6 shows a schematic block diagram with an integrated circuit comprising a controller, a first memory portion and a second memory portion.

FIG. 6 shows a schematic block diagram with an integrated circuit 601 comprising a controller 602, a first memory portion 603 and a second memory portion 604. The controller 601 is arranged to determine the type of the first memory portion 603, to conduct an erase operation for the first memory portion 603 and to adjust a disturb signal, in particular a disturb voltage for the second memory portion 604 during such an erase operation. The first memory portion 603 and the second memory portion 604 can be coupled, e.g., via a common well.

It is further noted that, while the programming scheme is illustrated and described herein also in terms of an erase scheme and with respect to flash cells, in particular with respect to EEPROMs, the scheme according to the present disclosure can be readily modified or adapted for use with any type of non-volatile memory such as floating gate NVMs (non-volatile memories), PCRAM (phase-change memory), CBRAM (conductive-bridging RAM), nano-crystal NVM, MONOS (metal-oxide-nitride-oxide-semiconductor), TANOS (Oxide-SiN-Al2O3-TaN), to name a few, and can be employed for programming operations including both erasing and writing operations.

It is also noted that the term "programming", as used herein, refers to adjusting a storage parameter of a non-volatile memory cell, either to a high level or a low level, including by writing (via write pulses) and erasing (via erase pulses).

By using a programming scheme according to embodiments of the present disclosure, the erase time of a non-volatile memory can be reduced relative to conventional erase techniques using iterative pulsing.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of operating an integrated circuit, the method comprising:
   determining at least one characteristic a first memory portion; and
   conducting an operation for a first memory portion, wherein based on the at least one characteristic determined for the first memory portion a disturbance for a second memory portion is adjusted;
   wherein the disturbance for the second memory portion is adjusted by adjusting a disturb signal for the second memory portion;

adjusting the disturb signal dependent on a number of access cycles already conducted for the first memory portion; and wherein the first memory portion and the second memory portion are located on a non-volatile memory.

2. The method according to claim 1, wherein the at least one characteristic comprises at least one usage characteristic that indicates a number of operations of the first memory portion.

3. The method according to claim 1, wherein the first memory portion and the second memory portion are electrically coupled.

4. The method according to claim 1, wherein the operation comprises at least one of:
a read operation;
a write operation; and
an erase operation.

5. The method according to claim 1, wherein the disturb signal comprises a disturb voltage applied between a first terminal and a second terminal of the at least one additional memory cell.

6. The method according to claim 5, wherein the first terminal is a control gate and the second terminal is a drain, a source or a well.

7. The method according to claim 1, wherein the first memory portion and the second memory portion share a well of the integrated circuit.

8. The method according to claim 1, wherein the first memory portion of the at least one memory cell is determined via a predefined parameter or based on access patterns to the first memory portion.

9. The method according to claim 1, wherein the first memory portion and the at least one second memory portion are each organized in blocks or pages.

10. The method according to claim 1, wherein the first memory portion and the at least one second memory portion are part of the same integrated circuit.

11. The method according to claim 1, wherein the integrated circuit comprises at least one non-volatile memory selected from the following group: EEPROM; floating gate NVM; PCRAM; CBRAM; nano-crystal NVM; MONOS; and TANOS.

12. The method according to claim 1, wherein the at least one characteristic of the first memory portion depends on the size or the usage of the first memory portion at least one memory cell.

13. The method according to claim 1, wherein the at least one characteristic of the first memory portion is one of:
a first characteristic indicating that the memory portion is rarely changed and thus rarely erased; and
a second characteristic indicating that the memory portion is frequently changed and thus often accessed.

14. The method according to claim 13, wherein the operation is conducted with a low disturb voltage when the first memory portion is of the first characteristic.

15. The method according to claim 13, wherein the operation is conducted with a high disturb voltage when the first memory portion is of the second characteristic.

16. The method according to claim 1, wherein the operation comprises a read operation to determine whether the operation or an access was successful.

17. The method according to claim 16, wherein a subsequent operation is adjusted based on the success of the previous operation or access.

18. The method according to claim 17, wherein the subsequent operation is an iteration of the previous operation or the subsequent operation applies a different voltage and/or a different pulse length as the previous operation.

19. The method of claim 1, wherein the first memory portion and the second memory portion are coupled via a well of a non-volatile memory.

20. An integrated circuit, comprising:
a non-volatile memory comprising a first memory portion and a second memory portion; and
a controller configured to:
determine at least one characteristic of the first memory portion;
conduct an operation for the first memory portion, wherein based on the at least one characteristic determined for the first memory portion a disturbance for the second memory portion is adjusted;
adjust the disturbance for the second memory portion by adjusting a disturb signal for the second memory portion; and
adjust the disturb signal dependent on a number of access cycles already conducted for the first memory portion.

21. The integrated circuit according to claim 20, wherein the operation comprises at least one of:
a read operation;
a write operation; and
an erase operation.

22. The integrated circuit according to claim 20, wherein the controller is configured to adjust the disturbance for the second memory portion by adjusting a disturb signal for the second memory portion.

23. The integrated circuit according to claim 22, wherein the controller is configured to adjust the disturb signal such that:
for a first characteristic indicating that the first memory portion is rarely changed, an operation is conducted with a low disturb voltage; and
for a second characteristic indicating that the first memory portion is frequently changed, the operation is conducted with a high disturb voltage.

24. The integrated circuit according to claim 22, wherein the controller is configured to determine a success of a previous operation via a read operation and to adjust the disturb signal based on this success.

25. The integrated circuit according to claim 20, wherein the first memory portion and the second memory portion are each organized in blocks or pages.

26. The integrated circuit according to claim 20, wherein the first memory portion and the second memory portion each comprise at least one non-volatile memory selected from the following group: EEPROM; floating gate NVM; PCRAM; CBRAM; nano-crystal NVM; MONOS; and TANOS.

27. A system for operating an integrated circuit comprising a non-volatile memory, the non-volatile memory comprising a first memory portion and a second memory portion, the system, comprising:
means for determining at least one characteristic of the first memory portion;
means for conducting an operation for the first memory portion, wherein based on the at least one characteristic determined a disturbance for the second memory portion is adjusted,
means for adjusting the disturbance for the second memory portion by adjusting a disturb signal for the second memory portion, and
means for adjusting the disturb signal dependent on a number of access cycles already conducted for the first memory portion.

28. The system according to claim 27, wherein the operation comprises at least one of:
 a read operation;
 a write operation; and
 an erase operation.

29. The system according to claim 27, wherein the first memory portion and the second memory portion are parts of a single non-volatile memory.

* * * * *

UNITED STATES PATENT AND TRADEMARK OFFICE
CERTIFICATE OF CORRECTION

| | | |
|---|---|---|
| PATENT NO. | : 9,153,293 B2 | Page 1 of 1 |
| APPLICATION NO. | : 13/690299 | |
| DATED | : October 6, 2015 | |
| INVENTOR(S) | : T. Nirschl et al. | |

It is certified that error appears in the above-identified patent and that said Letters Patent is hereby corrected as shown below:

Claims

Column 7, lines 46, 47 (claim 12, lines 3, 4) please change "memory portion at least one memory cell." to -- memory portion. --

Signed and Sealed this
Fifth Day of April, 2016

Michelle K. Lee
*Director of the United States Patent and Trademark Office*